United States Patent
Laskaris et al.

[11] Patent Number: 6,157,279
[45] Date of Patent: Dec. 5, 2000

[54] OPEN MAGNET HAVING SHIELDING

[75] Inventors: Evangelos Trifon Laskaris, Niskayuna; Michael Anthony Palmo, Ballston Spa, both of N.Y.; Bu-Xin Xu, Florence, S.C.; Michele Dollar Ogle, Burnt Hills; Bruce Campbell Amm, Clifton Park, both of N.Y.

[73] Assignee: General Electric Company, Schenectady, N.Y.

[21] Appl. No.: 09/419,014

[22] Filed: Oct. 13, 1999

Related U.S. Application Data

[63] Continuation of application No. 09/199,096, Nov. 24, 1998, Pat. No. 5,999,075, which is a continuation-in-part of application No. 09/061,415, Apr. 16, 1998, Pat. No. 5,883,558, and a continuation-in-part of application No. 09/026,390, Feb. 19, 1998, Pat. No. 5,874,882.

[51] Int. Cl.[7] ..................................................... H01H 5/00
[52] U.S. Cl. .......................................... 335/299; 335/301
[58] Field of Search ............................ 335/216, 299–301; 324/318–20

[56] References Cited

U.S. PATENT DOCUMENTS

| | | | |
|---|---|---|---|
| 4,896,128 | 1/1990 | Wollen et al. | 335/299 |
| 5,448,214 | 9/1995 | Laskaris | 335/301 |
| 5,463,364 | 10/1995 | Mueller | 335/299 |
| 5,874,880 | 2/1999 | Laskaris et al. | 335/216 |
| 5,874,882 | 2/1999 | Laskaris et al. | 335/299 |
| 5,999,075 | 12/1999 | Laskaris et al. | 335/299 |

*Primary Examiner*—Lincoln Donovan
*Attorney, Agent, or Firm*—Marvin Snyder; Douglas E. Stoner

[57] ABSTRACT

An open magnet useful in magnetic resonance imaging (MRI) applications. The magnet has two spaced-apart assemblies. Each assembly has a shielding coil located longitudinally outward from a main coil, a magnetizable member not carrying an electric current and spaced apart from and proximate the main and shielding coils, and a magnetizable pole piece spaced apart from the magnetizable member. The method of the invention generates a magnetic field in a first area between the two assemblies while shielding a second area not between the two assemblies from a stray magnetic field by creating the previously-described open magnet.

9 Claims, 4 Drawing Sheets

OPEN MAGNET HAVING SHIELDING

CROSS-REFERENCE TO RELATED APPLICATIONS

The present patent application is a continuation application of U.S. patent application Ser. No. 09/199,096 (which is hereby incorporated by reference in its entirety) by Evangelos T. Laskaris et al. which is entitled "Open Superconductive Magnet Having Shielding", which was filed Nov. 24, 1998, now U.S. Pat. No. 5,999,075, and which is a continuation-in-part application of U.S. patent application Ser. No. 09/061,415 by Evangelos T. Laskaris et al. which is entitled "Open Superconductive Magnet Having Shielding", which was filed Apr. 16, 1998, and which is now U.S. Pat. No. 5,883,558 and of U.S. patent application Ser. No. 09/026,390 by Evangelos T. Laskaris et al. which is entitled "Open And Shielded Superconductive Magnet", which was filed Feb. 19, 1998, and which is now U.S. Pat. No. 5,874,882.

FIELD OF THE INVENTION

The present invention relates generally to an open magnet used to generate a uniform magnetic field, and more particularly to such a magnet having shielding to protect the area around the magnet from stray magnetic fields originating from the magnet.

BACKGROUND OF THE INVENTION

Magnets include resistive and superconductive magnets which are part of a magnetic resonance imaging (MRI) system used in various applications such as medical diagnostics. Known superconductive magnets include liquid-helium-cooled and cryocooler-cooled superconductive magnets. Typically, the superconductive coil assembly includes a superconductive main coil surrounded by a first thermal shield surrounded by a vacuum enclosure. A cryocooler-cooled magnet typically also includes a cryocooler coldhead externally mounted to the vacuum enclosure, having its first cold stage in thermal contact with the thermal shield, and having its second cold stage in thermal contact with the superconductive main coil. A liquid-helium-cooled magnet typically also includes a liquid-helium vessel surrounding the superconductive main coil and a second thermal shield which surrounds the first thermal shield which surrounds the liquid-helium vessel.

Known resistive and superconductive magnet designs include closed magnets and open magnets. Closed magnets typically have a single, tubular-shaped resistive or superconductive coil assembly having a bore. The coil assembly includes several radially-aligned and longitudinally spaced-apart resistive or superconductive main coils each carrying a large, identical electric current in the same direction. The main coils are thus designed to create a magnetic field of high uniformity within a typically spherical imaging volume centered within the magnet's bore where the object to be imaged is placed. A single, tubular-shaped shielding assembly may also be used to prevent the high magnetic field created by and surrounding the main coils from adversely interacting with electronic equipment in the vicinity of the magnet. Such shielding assembly includes several radially-aligned and longitudinally spaced-apart resistive or superconductive shielding coils carrying electric currents of generally equal amperage, but in an opposite direction, to the electric current carried in the main coils and positioned radially outward of the main coils.

Open magnets, including "C" shape magnets, typically employ two spaced-apart coil assemblies with the space between the assemblies containing the imaging volume and allowing for access by medical personnel for surgery or other medical procedures during magnetic resonance imaging. The patient may be positioned in that space or also in the bore of the toroidal-shaped coil assemblies. The open space helps the patient overcome any feelings of claustrophobia that may be experienced in a closed magnet design. Known open magnet designs having shielding include those wherein each coil assembly has an open bore and contains a resistive or superconductive shielding coil positioned longitudinally and radially outward from the resistive or superconductive main coil(s). In the case of a superconductive magnet, a large amount of expensive superconductor is needed in the main coil to overcome the magnetic field subtracting effects of the shielding coil. Calculations show that for a 0.75 Tesla magnet, generally 2,300 pounds of superconductor are needed yielding an expensive magnet weighing generally 12,000 pounds. The modest weight makes this a viable magnet design.

It is also known in open magnet designs to place an iron pole piece in the bore of a resistive or superconductive coil assembly which lacks a shielding coil. The iron pole piece enhances the strength of the magnetic field and, by shaping the surface of the pole piece, magnetically shims the magnet improving the homogeneity of the magnetic field. An iron return path is used to connect the two iron pole pieces. It is noted that the iron pole piece also acts to shield the magnet. However, a large amount of iron is needed in the iron pole piece to achieve shielding in strong magnets. In the case of a superconductive magnet, calculations show that for a 0.75 Tesla magnet, only generally 200 pounds of superconductor are needed yielding a magnet weighing over 70,000 pounds which is too heavy to be used in medical facilities such as hospitals. The weight does not make this a viable magnet design.

What is needed is an open magnet design having shielding which is light enough to be used in medical facilities and which is less expensive than known designs.

SUMMARY OF THE INVENTION

In a first embodiment, the open magnet of the invention includes a first assembly and a second assembly longitudinally spaced apart from the first assembly.

The first assembly includes a generally longitudinally-extending first axis, at least one main coil, at least one shielding coil, at least one magnetizable member which is not carrying an electric current, and at least one magnetizable pole piece. The at least one main coil, the at least one shielding coil, and the at least one magnetizable pole piece are generally coaxially aligned with the first axis. The at least one main coil carries a first main electric current in a first direction, and the at least one shielding coil carries a first shielding electric current in a direction opposite to the first direction. The at least one shielding coil is positioned longitudinally outward from the at least one main coil. The at least one magnetizable member is spaced apart from and proximate the at least one main and shielding coils. The at least one magnetizable pole piece is spaced apart from the at least one magnetizable member.

The second assembly includes a generally longitudinally-extending second axis which is generally coaxially aligned with the first axis, at least one main coil, at least one shielding coil, at least one magnetizable member which is not carrying an electric current, and at least one magnetizable pole piece. The at least one main coil, the at least one shielding coil, and the at least one magnetizable pole piece are generally coaxially aligned with the second axis. The at least one main coil carries a second main electric current in a the previously-described first direction, and the at least one shielding coil carries a second shielding electric current in the previously-described opposite direction. The at least one shielding coil is positioned longitudinally outward from the at least one main coil. The at least one magnetizable member is spaced apart from and proximate the at least one main and shielding coils. The at least one magnetizable pole piece is spaced apart from the at least one magnetizable member.

In a first example, the method of the invention, for generating a magnetic field in a first area between a first and second assembly while shielding a second area not between said first and second assembly from a stray magnetic field emanating from the generation of the magnetic field in said first area, includes several steps. A step includes positioning as a first assembly at least one main coil, at least one shielding coil, at least one magnetizable member, and at least one magnetizable pole piece, wherein the at least one main coil carries a first electric current in a first direction, wherein the at least one shielding coil is located longitudinally outward from the at least one main coil and carries a first shielding electric current in a direction opposite to the first direction, wherein the at least one magnetizable member does not carry an electric current and is spaced apart from and proximate the at least one main and shielding coils, and wherein the at least one magnetizable pole piece is spaced apart from the at least one magnetizable member. Another step includes positioning as a second assembly at least one main coil, at least one shielding coil, at least one magnetizable member, and at least one magnetizable pole piece, wherein the at least one main coil carries a second electric current in the previously-described first direction, wherein the at least one shielding coil is located longitudinally outward from the at least one main coil and carries a second shielding electric current in the previously-described opposite direction, wherein the at least one magnetizable member does not carry an electric current and is spaced apart from and proximate the at least one main and shielding coils, and wherein the at least one magnetizable pole piece is spaced apart from the at least one magnetizable member. An additional step is generally coaxially aligning the at least one main and shielding coils and pole piece of the first and second assemblies with a generally longitudinally-extending axis. A further step is longitudinally spacing apart the second assembly from the first assembly.

Several benefits and advantages are derived from the invention. The at least one pole piece and the at least one magnetizable member enhance the strength of the magnetic field so less conductor or superconductor is needed in the at least one main coil. The at least one magnetizable member provides a partial magnetic flux return for the at least one main coil which reduces the magnetizable material needed in the at least one pole piece and which reduces the amount of conductor or superconductor needed in the at least one main coil. The at least one magnetizable member also magnetically decouples the at least one shielding coil from the at least one main coil so that the magnetic flux lines from the at least one shielding coil are captured by the at least one magnetizable member and do not reach the magnetic flux lines from the at least one main coil. Thus the magnetizable mass of the at least one pole piece does not have to be increased, and the amount of the conductor or superconductor in the at least one main coil does not have to be increased, to offset the field subtracting effects of the magnetic flux lines from the at least one shielding coil, since they are blocked by the presence of the at least one magnetizable member. In the case of a superconductive magnet, computer simulations show that a 0.7 Tesla magnet of the present invention would use generally 800 pounds of superconductor yielding a magnet weighing generally 16,000 pounds (which is light enough to be installed in a medical facility) and costing only half of what a viable equivalent conventional magnet would cost.

DETAILED DESCRIPTION OF THE INVENTION

Figure 1:
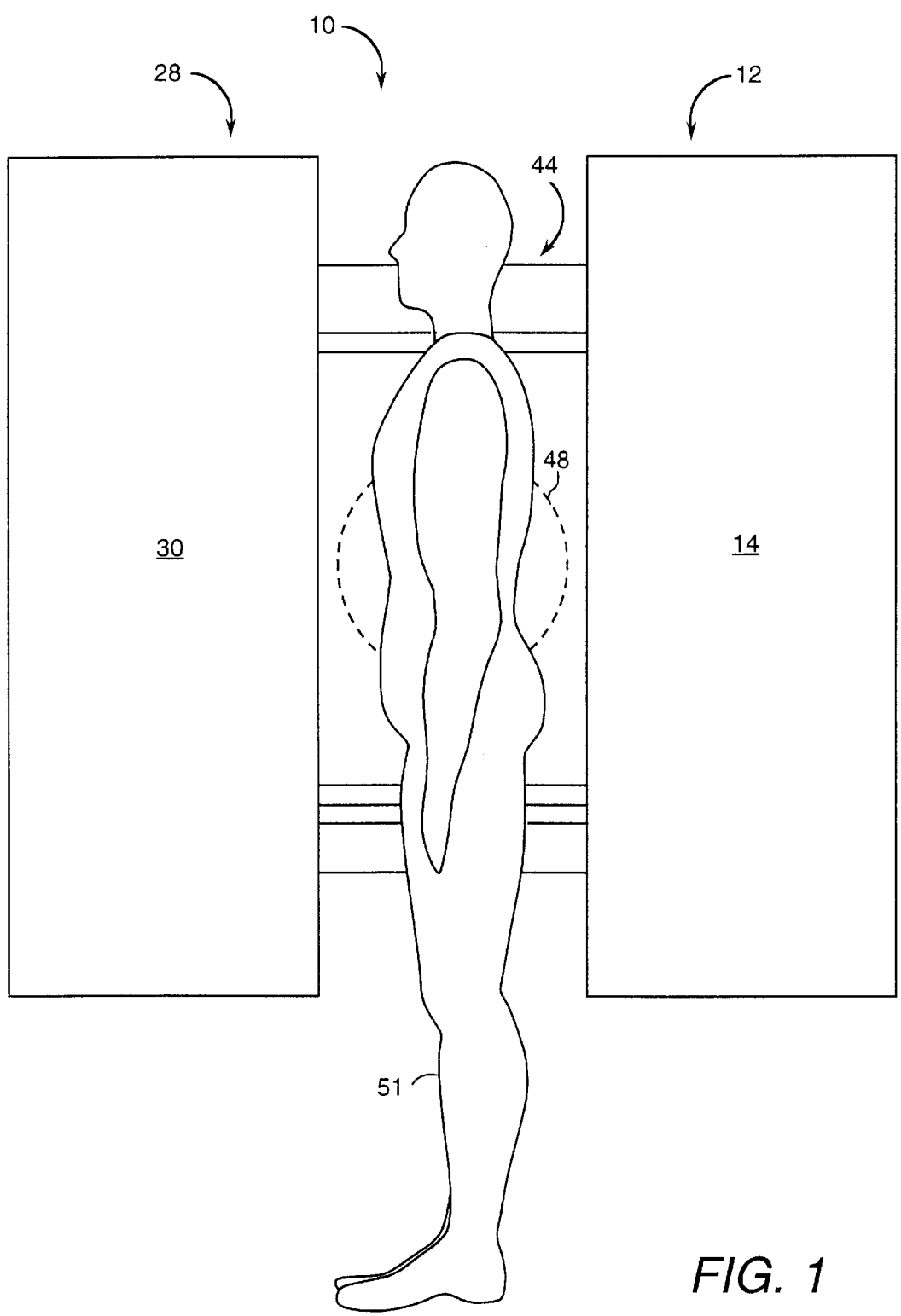
FIG. 1 is a schematic front elevational view of a first embodiment of the open magnet of the invention.
Figure 2:
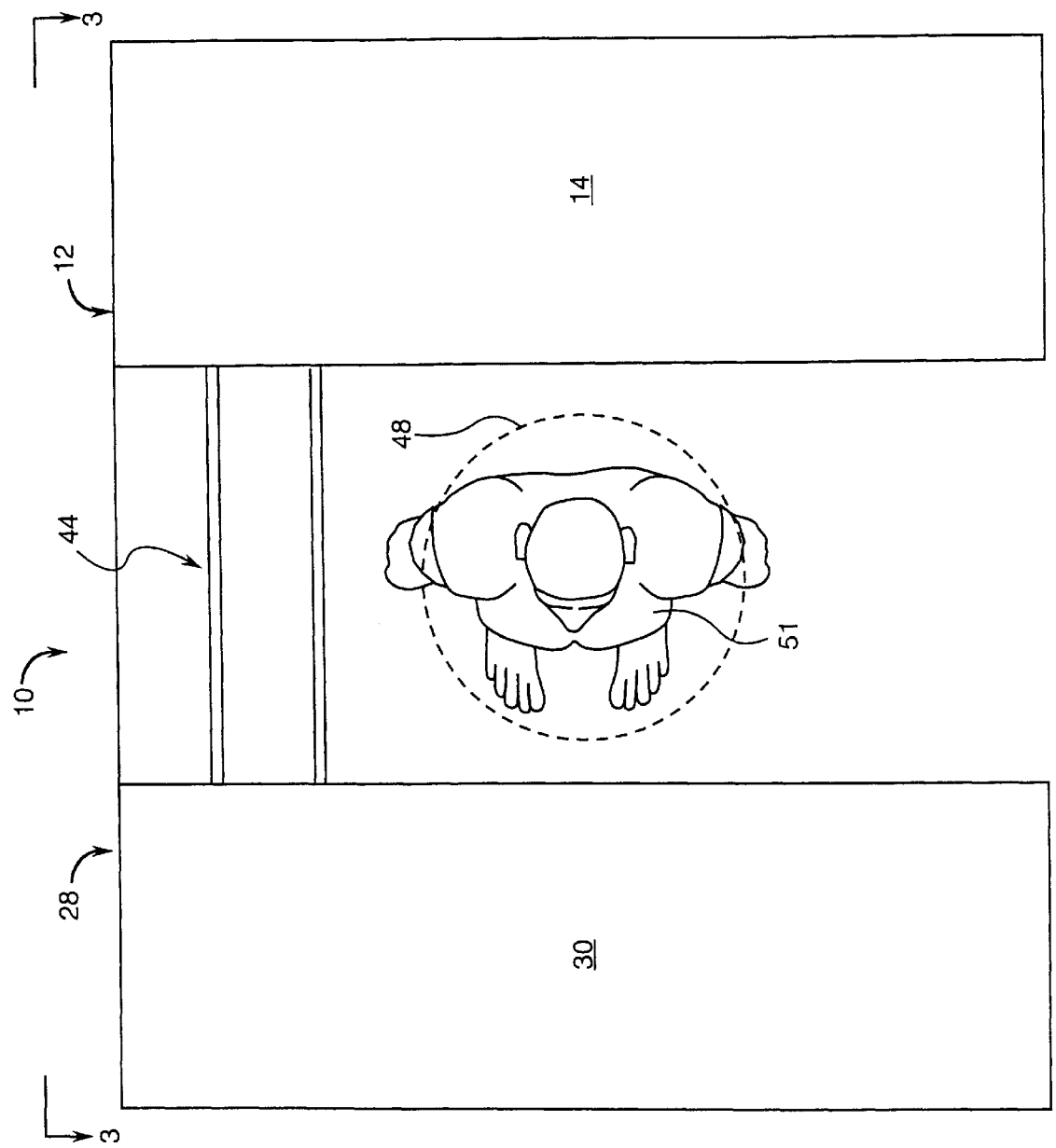
FIG. 2 is a schematic top planar view of the magnet of FIG. 1.

Referring now to the drawings, wherein like numerals represent like elements throughout, FIGS. 1–4 show a first embodiment of the open magnet 10 of the present invention. Magnet 10 is a superconductive magnet. In an example, the magnet 10 is a 0.5 Tesla or higher magnet. The magnet 10 includes a first assembly 12. The first assembly 12 includes a generally toroidal-shaped first vacuum enclosure 14 surrounding a first bore 16 and having a generally longitudinally-extending first axis 18. In an example, the first vacuum enclosure 14 consists essentially of nonmagnetic stainless steel or aluminum.

The first assembly 12 also includes a generally annular-shaped first superconductive main coil 20 generally coaxially aligned with the first axis 18 and disposed within the first vacuum enclosure 14. The first superconductive main coil 20 carries a first main electric current in a first direction. The first direction is defined to be either a clockwise or a counterclockwise circumferential direction about the first axis 18 with any slight longitudinal component of current direction being ignored. It is noted that additional first superconductive main coils may be needed to achieve a high magnetic field strength, within the magnet's imaging volume, without exceeding the critical current density of the superconductor being used in the superconductive coils, as is known to those skilled in the art. An example of a superconductor for the first superconductive main coil 20 is niobium-titanium.

The first assembly 12 additionally includes a generally annular-shaped first superconductive shielding coil 22 generally coaxially aligned with the first axis 18. The first superconductive shielding coil 22 is disposed within the first vacuum enclosure 14 longitudinally outward from the first superconductive main coil 20. The first superconductive shielding coil 22 carries a first shielding electric current in a direction opposite to the previously-defined first direction. An example of a superconductor for the first superconductive shielding coil 22 is niobium-titanium.

The first assembly 12 further includes a magnetizable and generally annular-shaped first ring 24 generally coaxially aligned with the first axis 18 and disposed within the first vacuum enclosure 14. The first ring 24 is spaced apart from the first superconductive main and shielding coils 20 and 22. In an example, the first ring 24 consists essentially of a ferromagnetic material. In an example, the first ring 24 consists essentially of carbon steel.

The first assembly 12 moreover includes a magnetizable and generally cylindrical-shaped first pole piece 26 generally coaxially aligned with the first axis 18. The first pole piece 26 is disposed inside the first bore 16 and outside the first vacuum enclosure 14. In an example, the first pole piece 26 consists essentially of a ferromagnetic material. In an example, the first pole piece 26 consists essentially of iron. In an exemplary embodiment, the first pole piece 26 is attached to the first vacuum enclosure 14.

The open superconductive magnet 10 also includes a second assembly 28. The second assembly 28 includes a generally toroidal-shaped second vacuum enclosure 30 surrounding a second bore 32 and having a generally longitudinally-extending second axis 34 generally coaxially aligned with the first axis 18. The second vacuum enclosure 30 is longitudinally spaced apart from the first vacuum enclosure 14. In an example, the second vacuum enclosure 30 consists essentially of nonmagnetic stainless steel or aluminum.

The second assembly 28 also includes a generally annular-shaped second superconductive main coil 36 generally coaxially aligned with the second axis 34 and disposed within the second vacuum enclosure 30. The second superconductive main coil 36 carries a second main electric current in the previously-defined first direction. It is noted that additional second superconductive main coils may be needed to balance any additional first superconductive main coils present in the first assembly, as is known to those skilled in the art. An example of a superconductor for the second superconductive main coil 36 is niobium-titanium.

The second assembly 28 additionally includes a generally annular-shaped second superconductive shielding coil 38 generally coaxially aligned with the second axis 34. The second superconductive shielding coil 38 is disposed within the second vacuum enclosure 30 longitudinally outward from the second superconductive main coil 36. The second superconductive shielding coil 38 carries a second shielding electric current in the previously-defined opposite direction. The first and second superconductive main coils 20 and 36 are longitudinally closer to each other than are the first and second superconductive shielding coils 22 and 38. An example of a superconductor for the second superconductive shielding coil 38 is niobium-titanium.

The second assembly 28 further includes a magnetizable and generally annular-shaped second ring 40 generally coaxially aligned with the second axis 34 and disposed within the second vacuum enclosure 30. The second ring 40 is spaced apart from the second superconductive main and shielding coils 36 and 38. In an example, the second ring 40 consists essentially of a ferromagnetic material. In an example, the second ring 40 consists essentially of carbon steel.

The second assembly 28 moreover includes a magnetizable and generally cylindrical-shaped second pole piece 42 generally coaxially aligned with the second axis 34. The second pole piece 42 is disposed inside the second bore 32 and outside the second vacuum enclosure 30. The second pole piece 42 is longitudinally spaced apart from, and without a magnetizable solid path to, the first pole piece 26. In an example, the second pole piece 42 consists essentially of a ferromagnetic material. In an example, the second pole piece 42 consists essentially of iron. In an exemplary embodiment, the second pole piece 42 is attached to the second vacuum enclosure 30.

In an exemplary construction, the open superconductive magnet 10 includes only one support member 44 connecting the first and second assemblies 12 and 28, and desirably connecting the first and second pole pieces 26 and 42 of the first and second assemblies 12 and 28. The support member 44 is a nonmagnetizable support member typically consisting essentially of nonmagnetic stainless steel. The support member 44 is disposed longitudinally completely between the first and second pole pieces 26 and 42. In an example, the support member 44 and the first and second assemblies 12 and 28 together have a generally "C" shape when viewed in a cross section of the magnet 10 created by a cutting plane, wherein the first axis 18 lies completely in the cutting plane, and wherein the cutting plane generally bisects the support member 44. It is noted that the previously-defined cross section is the cross section shown in FIG. 3, with the "C" shape seen by rotating FIG. 3 ninety degrees counterclockwise.

In an example, the second assembly 28 is a general mirror image of the first assembly 12 about a plane 46 (seen on edge as a dashed line in FIG. 3) disposed longitudinally equidistant between the first-and-second assemblies 12 and 28 and oriented generally perpendicular to the first axis 18. When the magnet 10 is employed as an MRI (magnetic resonance imaging) magnet, the magnet 10 includes a magnetic resonance imaging volume 48 (seen as a dotted line in FIGS. 1–3) disposed generally longitudinally equidistant between the first and second assemblies 12 and 28. In an example, the imaging volume 48 is a generally spherical imaging volume having a center 50 lying generally on the first axis 18. A patient 51 is shown in an imaging position in FIGS. 1 and 2. It is noted that the magnetic field in the imaging volume 48 has a direction and that the direction can have any orientation depending on the orientation of the coaxially-aligned first and second axes 18 and 34. The magnetic field has a horizontal direction in the imaging volume 48 of FIG. 3. It is noted that if the magnet 10 were physically rotated ninety degrees such that the patient 51 were in a prone or supine position (such as the patient being on a patient table not shown in the figures), the magnetic field in the imaging volume would have a vertical direction.

It is noted that the superconductive coils 20, 22, 36, and 38 are cooled, to a temperature below their critical temperature to achieve and sustain superconductivity, typically by liquid-helium (or other cryogenic) cooling, by cryocooler cooling, or by a combination thereof. It is also noted that the first and second rings 24 and 40 are cooled to the same cryogenic temperature as the superconductive coils 20, 22, 36, and 38. In a first cooling option (see FIG. 4), illustrated in the first assembly 12, the magnet 10 also includes a first cryogenic vessel 52 disposed within the first vacuum enclosure 14 and surrounding the first superconductive main and shielding coils 20 and 22 and the first ring 24. The first cryogenic vessel 52 contains a liquid cryogen 54, such as one consisting essentially of liquid helium. In an example, the first cryogenic vessel 52 consists essentially of aluminum or nonmagnetic stainless steel.

In the first cooling option, in an example, the first assembly 12 also includes a first thermal shield 56, an inner support cylinder 58, and an outer support cylinder 60 all disposed within the first vacuum enclosure 14. The first thermal shield 56 is disposed between, and spaced apart from, the first cryogenic vessel 52 and the first vacuum enclosure 14. The inner support cylinder 58 is generally coaxially aligned with the first axis 18, has a first end secured to the first vacuum enclosure 14, and has a second end secured to the first thermal shield 56. The outer support cylinder 60 is generally coaxially aligned with the first axis 18, has a first end secured to the first thermal shield 56, and has a second end secured to the first cryogenic vessel 52. In an exemplary construction, the first thermal shield 56 consists essentially of aluminum, and the inner and outer support cylinders 58 and 60 consist essentially of a fiber-reinforced composite. In an example, the above-described securing of the ends of the nonmetallic support cylinders is accomplished by forming a rounded rim in the ends of the support cylinders and by using metal rings to capture the rims, some of such rings being attached to the metallic vacuum enclosure, the metallic thermal shield, or the metallic cryogenic vessel, as appropriate and as can be appreciated by the artisan. It is noted that the inner and outer support cylinders 58 and 60 are under tension and provide a superior system for mechanically supporting the magnet components within the first vacuum enclosure 14 against the magnetic forces generated by the magnet 10, as can be understood by those skilled in the art.

In a second cooling option, illustrated in the second assembly 28, the magnet 10 also includes a cryocooler coldhead 62 having a housing 64 attached to the second vacuum enclosure 30 and having a cold stage 66 which is in solid thermal conduction contact with the second superconductive shielding coil 38 and which is, by an interconnecting thermal busbar (not shown in the figures), in thermal conduction contact with the second superconductive main coil 36.

Figure 4:
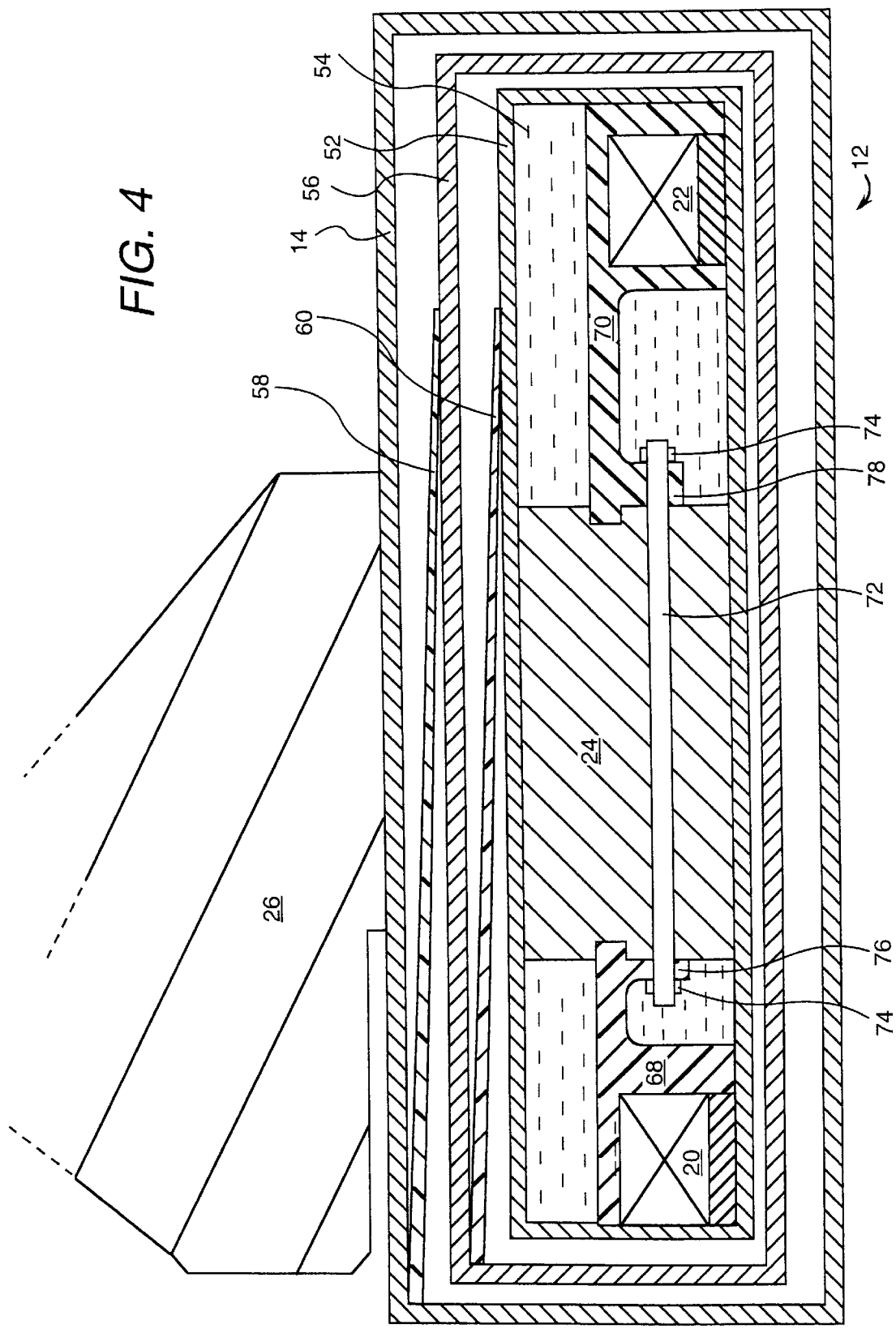
FIG. 4 is a detailed schematic view of a lower-right portion of the magnet shown in FIG. 3.

Other cooling options (not shown in the figures) include each assembly having its own cryogenic vessel, wherein the liquid cryogen in one cryogenic vessel is in fluid communication with the liquid cryogen in the other cryogenic vessel through an interconnecting thermally-insulated conduit disposed either within the support member or alongside the support member. Alternately, a solid thermal conduction path can be placed in the support member allowing the cryocooler coldhead on the second vacuum enclosure to also cool the superconductive main and shielding coil in the first vacuum enclosure. Typically one (as shown in FIG. 4) or more thermal shields are spaced apart from, and surround, the superconductive main and shielding coils. For cryogenic-cooling, such thermal shields (as shown in FIG. 4) are located outside the cryogenic vessel. To thermally interconnect the two assemblies, the vacuum enclosures, the thermal shields, and (if present) the cryogenic vessels of each assembly are interconnected, such as in the vicinity of the support member. It is noted that, with any cooling option, the magnet 10 moreover includes, as needed, thermal spacers and coil forms, as is known to the artisan, for proper spacing and support of the magnet components, such spacers being omitted from the figures for clarity, and such coil forms to be hereinafter discussed.

In an exemplary construction, the first assembly 12 includes a main coil form 68, a shielding coil form 70, a plurality of spaced-apart bolts 72 (only one of which is shown in the figures), and a multiplicity of internally-threaded nuts 74 (only two of which are shown in the figures). The main coil form 68 is disposed within the first vacuum enclosure 14, supports the first superconductive main coil 20, and has a main flange 76 abutting the first ring 24. The shielding coil form 70 is disposed within the first vacuum enclosure 14, supports the first superconductive shielding coil 22, and has a shielding flange 78 abutting the first ring 24. The bolts 72 each are disposed within the first vacuum enclosure 14 and together are arrayed circumferentially about the first axis 18. The bolts 72 each are aligned generally parallel to the first axis 18, and the bolts 72 each pass completely through the main flange 76, the first ring 24, and the shielding flange 78. Each of the bolts 72 has an externally-threaded longitudinally-outer end extending longitudinally outward and beyond the shielding flange 76 and an externally-threaded longitudinally-inner end extending longitudinally inward and beyond the main flange 76. The nuts 74 are threadably engaged on the longitudinally-inner and longitudinally-outer ends of the bolts 72. It is noted that the first and second rings 24 and 40 do not contain any threads because, being typically made of carbon steel, they are brittle at cryogenic temperatures. In an example, the main and shielding coil forms 68 and 70 consist essentially of fiberglass. Fiberglass insulation may be placed between a superconductive coil and a cryogenic vessel, and an aluminum overband (with intervening fiberglass insulation) may surround a superconductive coil, if desired for thermal and stress reasons, and as can be appreciated by those skilled in the art.

In an exemplary design, the first ring 24 is disposed longitudinally between the first superconductive main and shielding coils 20 and 22, and the second ring 40 is disposed longitudinally between the second superconductive main and shielding coils 36 and 38. Also, the first superconductive main coil 20 is disposed longitudinally closer to the first ring 24 than is the first superconductive shielding coil 22, and the second superconductive main coil 36 is disposed longitudinally closer to the second ring 40 than is the second superconductive shielding coil 38. Moreover, a longitudinal projection of the first ring 24 onto the previously-defined plane 46 completely covers a longitudinal projection of the first superconductive main coil 20 onto the previously-defined plane 46 and completely covers a longitudinal projection of the first superconductive shielding coil 22 onto the previously-defined plane 46. Likewise, a longitudinal projection of the second ring 40 onto the previously-defined plane 46 completely covers a longitudinal projection of the second superconductive main coil 36 onto the previously-defined plane 46 and completely covers a longitudinal projection of the second superconductive shielding coil 38 onto the previously-defined plane 46. Additionally, a longitudinal projection of the first superconductive shielding coil 22 onto the previously-defined plane 46 covers at least half of a longitudinal projection of the first superconductive main coil 20 onto the previously-defined plane 46, and a longitudinal projection of the second superconductive shielding coil 38 onto the previously-defined plane 46 covers at least half of a longitudinal projection of the second superconductive main coil 36 onto the previously-defined plane 46. In an example, the first superconductive main and shielding coils 20 and 22 are the only superconductive coils disposed within the first vacuum enclosure 14, and the second superconductive main and shielding coils 36 and 38 are the only superconductive coils disposed within the second vacuum enclosure 30.

Figure 3:
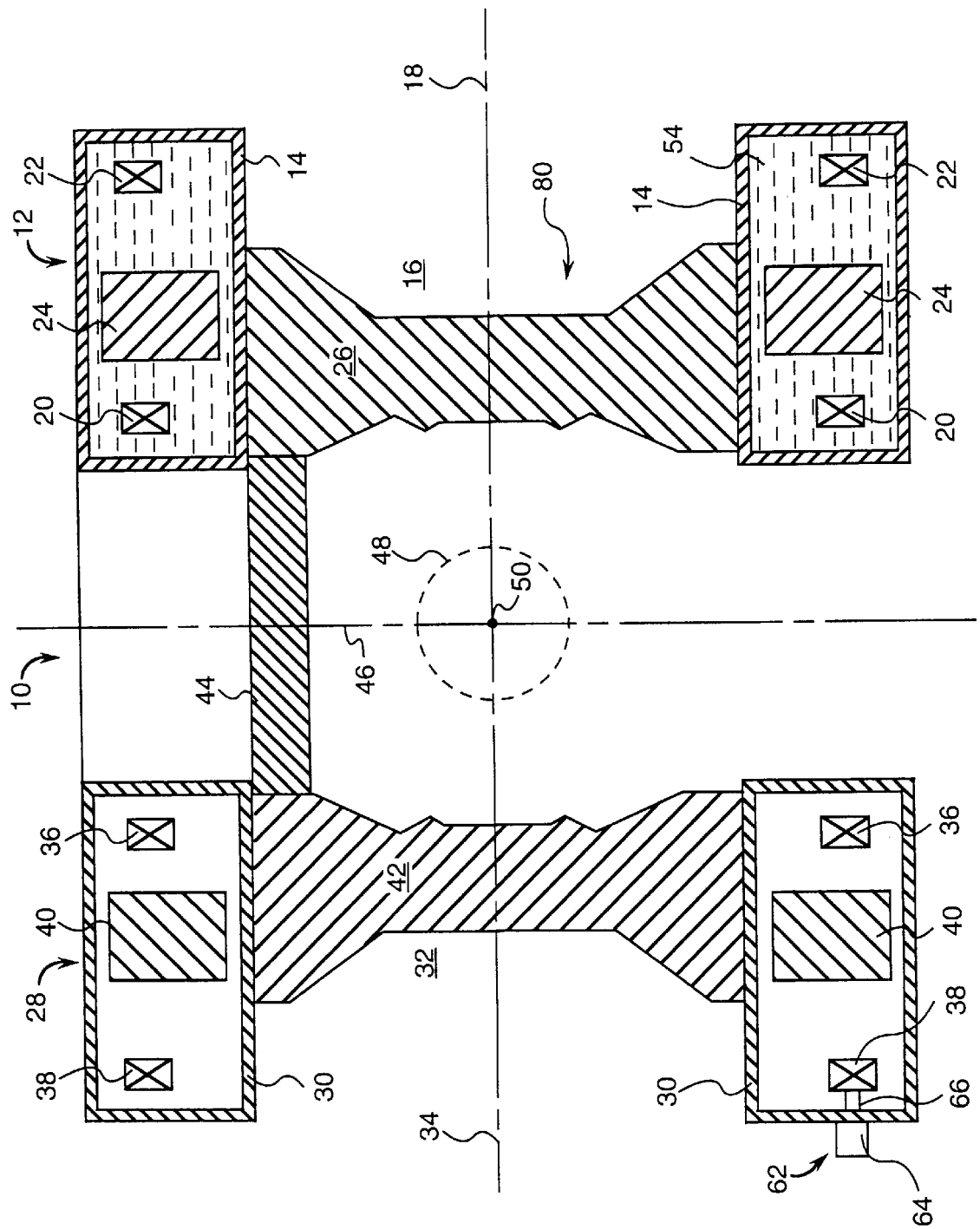
FIG. 3 is a cross sectional view of the magnet of FIGS. 1 and 2 taken along lines 3—3 of FIG. 2 with the addition of a cryocooler coldhead.

It is noted that those skilled in the art, using computer simulations based on conventional magnetic field analysis techniques, and using the teachings of the present invention, can design an open magnet with a desired magnetic field strength, a desired level of magnetic field inhomogenity, and a desired level of shielding (i.e., a desired position of the 5 Gauss stray magnetic field from the center of the imaging volume of the open magnet). It is noted, as shown in FIG. 3, that such analysis shows that a coaxially-aligned disk of iron can be removed from the longitudinally-outer area 80 of the first pole piece 26 without affecting the performance of the magnet 10, as can be appreciated by those skilled in the art. As previously mentioned, the pole piece and the ring enhance the strength of the magnetic field so less conductor or superconductor is needed in the main coil. The carbon steel ring provides a partial magnetic flux return for the main coil which reduces the iron needed in the pole piece and which reduces the amount of conductor or superconductor needed in the main coil. The carbon steel ring also magnetically decouples the shielding coil from the main coil so that the magnetic flux lines from the shielding coil are captured by the carbon steel ring and do not reach the magnetic flux lines from the main coil. Thus the iron mass of the pole piece does not have to be increased, and the amount of the conductor or superconductor in the main coil does not have to be increased, to offset the field subtracting effects of the magnetic flux lines from the shielding coil, since they are blocked by the presence of the carbon steel ring. In the case of a superconductive magnet, computer simulations show that a 0.7 Tesla magnet of the present invention, with the 5 Gauss stray magnetic field contained vertically within 3.8 meters, and horizontally within 4.8 meters, from the center 50 of the imaging volume 48 of the magnet 10, would use generally 800 pounds of superconductor yielding a magnet weighing generally 16,000 pounds (which is light enough to be installed in a medical facility) and costing only half of what a viable equivalent conventional magnet would cost.

As will be apparent to the artisan in view of the description of the above embodiments, the magnet of the invention can be more broadly expressed as an open magnet 10 having a first assembly 12 and a second assembly 28 which is longitudinally spaced apart from the first assembly 12. The first assembly 12 includes a generally longitudinally-extending first axis 18, at least one main coil 20, at least one shielding coil 22 disposed longitudinally outward from the at least one main coil 20, at least one magnetizable member 24 which is not carrying an electric current, and at least one magnetizable pole piece 26. The at least one main coil 20, shielding coil 22, and magnetizable pole piece 26 are generally coaxially aligned with the first axis 18. The at least one main coil 20 carries a first main electric current in a first direction, and the at least one shielding coil 22 carries a first shielding electric current in a direction opposite to the first direction. The at least one magnetizable member 24 is spaced apart from and proximate the at least one main and shielding coils 20 and 22, and the at least one magnetizable pole piece 26 is spaced apart from the at least one magnetizable member 24. The second assembly 28 includes a generally longitudinally-extending second axis 34 generally coaxially aligned with the first axis 18, at least one main coil 36, at least one shielding coil 38 disposed longitudinally outward from the at least one main coil 36, at least one magnetizable member 40 which is not carrying an electric current, and at least one magnetizable pole piece 42. The at least one main coil 36, shielding coil 38, and magnetizable pole piece 42 are generally coaxially aligned with the second axis 34. The at least one main coil 36 carries a second main electric current in the previously-described first direction, and the at least one shielding coil 38 carries a second shielding electric current in the previously-described opposite direction. The at least one magnetizable member 40 is spaced apart from and proximate the at least one main and shielding coils 36 and 38, and the at least one magnetizable pole piece 26 is spaced apart from the at least one magnetizable member 40.

The at least one pole piece and the at least one magnetizable member enhance the strength of the magnetic field so less conductor or superconductor is needed in the at least one main coil. The at least one magnetizable member provides a partial magnetic flux return for the at least one main coil which reduces the magnetizable material needed in the at least one pole piece and which reduces the amount of conductor or superconductor needed in the at least one main coil. The at least one magnetizable member also magnetically decouples the at least one shielding coil from the at least one main coil so that the magnetic flux lines from the at least one shielding coil are captured by the at least one magnetizable member and do not reach the magnetic flux lines from the at least one main coil. Therefore, the magnetizable mass of the at least one pole piece does not have to be increased, and the amount of the conductor or superconductor in the at least one main coil does not have to be increased, to offset the field subtracting effects of the magnetic flux lines from the at least one shielding coil, since they are blocked by the presence of the at least one magnetizable ring.

Thus, the open magnet 10 is not limited to a superconductive magnet and can be a resistive magnet or a combination resistive and superconductive magnet. Likewise, the at least one main and shielding coils 20 & 36 and 22 and 38 are not limited to superconductive coils and can be resistive or a combination of resistive and superconductive coils. It is noted that the coils 20, 36, 22 and 38 are not limited to being one each, and the open magnet 10 can have two or more main coils 20, two or more main coils 36, two or more shielding coils 22, and two or more shielding coils 38 or any combination of one or more of such coils. Likewise, each at least one pole piece 26 and 42 and each at least one magnetizable member 24 and 40 is not limited in number. The shape of the coils 20, 36, 22, and 38 is not limited to being generally annular, the shape of the pole pieces 26 and 42 is not limited to being generally cylindrical, and the shape of the magnetizable members 24 and 40 is not limited to being a generally annular ring or even a ring, and any shape or combination of shapes suitable to creating a desired magnetic field can be used, as is within the design skill of the artisan using the teachings of the present invention. In an example, the least one magnetizable member 24 of the first assembly 12 comprises at least one magnetizable ring. It is noted that a ring may be made of a single member or made of several abutting or spaced apart and proximate members.

In an example, the open magnet 10 also includes at least one support member 44 connecting the first and second assemblies 12 and 28. It is noted that the at least one support member 44 is not limited in number, and open magnets of the invention can have one, two, three or any number of support members. It is also noted that the at least one support member 44 is not limited to one which does not provide a magnetizable solid path between the at least one pole piece 42 and the at least one pole piece 26. That is, the at least one pole piece 42 may have no magnetizable solid path to the at least one pole piece 26, or the at least one pole piece 42 may have a magnetizable solid path to the at least one pole piece 26.

In an example, the at least one main coil 20 (whether resistive or superconductive) of the first assembly 12 has a cryogenic temperature during operation of the magnet 10. It is noted that such cryogenic temperature is required when the at least one main coil 20 comprises and relies on a superconductor and is permissive but not required when the at least one main coil 20 comprises a conductor (i.e., a resistive conductor) and does not rely on a superconductor. Likewise, in another example the at least one shielding coil 22 of the first assembly 12 has a cryogenic temperature during operation of the magnet 10. In a further example, the at least one magnetizable member 24 of the first assembly 12 has a cryogenic temperature during operation of the magnet 10, and in an additional example, the at least one magnetizable member 24 of the first assembly 12 has a warmer-than-cryogenic temperature during operation of the magnet 10. When a component of the first or second assembly 12 or 28 of the magnet 10 (such as a coil or magnetizable member) has a cryogenic temperature during magnet operation, the component typically is disposed in a corresponding first or second vacuum enclosure 14 or 30. In the previously-described first cooling option, the component of the first assembly 12 is disposed in a first cryogenic vessel 52 which surrounds the component and which is itself disposed within the first vacuum enclosure 14. It is noted that, for example, a component (such as single coil or a single magnetizable member) can have its own vacuum enclosure (or its own cryogenic vessel and vacuum enclosure) or can share a vacuum enclosure (or a cryogenic vessel and vacuum enclosure) with one or more other components (such as one or more other coils or magnetizable members).

From the above description, it will be recognized that the invention can also be expressed as a method for generating a magnetic field in a first area (such as an imaging volume 48) between a first and second assembly 12 and 28 while shielding a second area (such as an area longitudinally and/or radially outward of the assembly pair) not between the first and second assembly 12 and 28 from a stray magnetic field emanating from the generation of the magnetic field in the first area. In one example, the method comprises several steps.

One step is disposing as a first assembly 12 at least one main coil 20, at least one shielding coil 22, at least one magnetizable member 24, and at least one magnetizable pole piece 26, wherein the at least one main coil 20 carries a first electric current in a first direction, wherein the at least one shielding coil 22 is disposed longitudinally outward from the at least one main coil 20 and carries a first shielding electric current in a direction opposite to the first direction, wherein the at least one magnetizable member 24 does not carry an electric current and is spaced apart from and proximate the at least one main and shielding coils 20 and 22, and wherein the at least one magnetizable pole piece 26 is spaced apart from the at least one magnetizable member 24.

Another step is disposing as a second assembly 28 at least one main coil 36, at least one shielding coil 38, at least one magnetizable member 40, and at least one magnetizable pole piece 42, wherein the at least one main coil 36 carries a second electric current in the previously-described first direction, wherein the at least one shielding coil 38 is disposed longitudinally outward from the at least one main coil 36 and carries a second shielding electric current in the previously-described opposite direction, wherein the at least one magnetizable member 40 does not carry an electric current and is spaced apart from and proximate the at least one main and shielding coils 36 and 38, and wherein the at least one magnetizable pole piece 42 is spaced apart from the at least one magnetizable member 40. An additional step is generally coaxially aligning the at least one main and shielding coils 20 & 36 and 22 & 38 and pole piece 26 and 42 of the first and second assemblies 12 and 28 with a generally longitudinally-extending axis 18 or 34. A further step is longitudinally spacing apart the second assembly 28 from the first assembly 12.

The foregoing description of several embodiments and examples of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

What is claimed is:

1. An open magnet comprising:
   a) a first assembly including:
      (1) a longitudinally-extending first axis;
      (2) at least one annular main coil coaxially aligned with said first axis and carrying a first main electric current in a first direction;
      (3) at least one annular shielding coil coaxially aligned with said first axis, disposed longitudinally outward from said at least one main coil of said first assembly, and carrying a first shielding electric current in a direction opposite to said first direction;
      (4) at least one magnetizable member positioned between coaxially aligned with, and proximate to said at least one main and shielding coils of said first assembly to decouple said at least one main and shielding coils; and
      (5) at least one magnetizable pole piece generally coaxially aligned with said first axis and spaced apart from said at least one magnetizable member of said first assembly;
   b) a second assembly longitudinally spaced apart from said first assembly and including:
      (1) a generally longitudinally-extending second axis generally coaxially aligned with said first axis;
      (2) at least one main coil generally coaxially aligned with said second axis and carrying a second main electric current in said first direction;
      (3) at least one shielding coil generally coaxially aligned with said second axis, disposed longitudinally outward from said at least one main coil of second assembly, and carrying a second shielding electric current in said opposite direction;
      (4) at least one magnetizable member positioned between, coaxially aligned with, and proximate said at least one main and shielding coils of said second assembly; and
      (5) at least one magnetizable pole piece generally coaxially aligned with said second axis and spaced apart from said at least one magnetizable member of said second assembly; and
   c) at least one nonmagnetizable support member abuttingly connecting said at least one magnetizable pole piece of said first assembly and said at least one magnetizable pole piece of said second assembly.

2. The magnet of claim 1, wherein said at least one support member is a nonmagnetizable support member disposed longitudinally completely between said first and second pole pieces.

3. The magnet of claim 2, wherein said at least one support member is a nonmagnetizable support member.

4. The magnet of claim 3, wherein said at least one support member consists essentially of nonmagnetic stainless steel.

5. An open magnet comprising:
   a) a first assembly including:
      (1) a longitudinally-extending first axis;
      (2) at least one main coil coaxially aligned with said first axis and carrying a first main electric current in a first direction;
      (3) at least one shielding coil coaxially aligned with said first axis, disposed longitudinally outward from said at least one main coil of said first assembly, and carrying a first shielding electric current in a direction opposite to said first direction;
      (4) at least one ring-shaped magnetizable member which is spaced apart from and intermediate said at least one main and shielding coils of said first assembly, wherein most of said at least one magnetizable member of said first assembly is disposed longitudinally between said at least one main and shielding coils of said first assembly; and (5) at least one magnetizable pole piece coaxially aligned with said first axis and spaced apart from said at least one magnetizable member of said first assembly, wherein most of said at least one magnetizable pole piece of said first assembly is disposed radially inward of said at least one main and shielding coils and said ring shaped magnetizable member of said first assembly;

b) a second assembly longitudinally spaced apart from said first assembly and including:

(1) a longitudinally-extending second axis coaxially aligned with said first axis;

(2) at least one main coil coaxially aligned with said second axis and carrying a second main electric current in said first direction;

(3) at least one shielding coil coaxially aligned with said second axis, disposed longitudinally outward from said at least one main coil of second assembly, and carrying a second shielding electric current in said opposite direction;

(4) at least one ring-shaped magnetizable member which is spaced apart from and intermediate said at least one main and shielding coils of said second assembly, wherein most of said at least one magnetizable member of said second assembly is disposed longitudinally between said at least one main and shielding coils of said second assembly; and (5) at least one magnetizable pole piece coaxially aligned with said second axis and spaced apart from said at least one magnetizable member of said second assembly, wherein most of said at least one magnetizable pole piece of said second assembly is disposed radially inward of said at least one main and shielding coils and said ring-shaped magnetizable member of said second assembly; and c) at least one non-magnetizable support member abuttingly connecting said at least one magnetizable pole piece of said first assembly and said at least one magnetizable pole piece of said second assembly.

6. The magnet of claim 5, wherein said at least one ring shaped magnetizable member of said first assembly and said at least one ring shaped magnetizable member of said second assembly are aligned with each other and said first assembly and said second assembly are mirror images about a plane midway therebetween.

7. The magnet of claim 5, wherein said at least one support member is a nonmagnetizable support member disposed longitudinally completely between said first and second pole pieces.

8. The magnet of claim 7, wherein said at least one support member is a nonmagnetizable support member.

9. The magnet of claim 8, wherein said at least one support member consists essentially of nonmagnetic stainless steel.

\* \* \* \* \*